(12) United States Patent
Wang et al.

(10) Patent No.: US 10,558,233 B1
(45) Date of Patent: Feb. 11, 2020

(54) DYNAMIC BIAS CURRENT GENERATOR AND ASSOCIATED ELECTRONIC DEVICE

(71) Applicant: Artery Technology Co., Ltd., Chongqing (CN)

(72) Inventors: Weitie Wang, Chongqing (CN); Baotian Hao, Chongqing (CN); Chao Li, Chongqing (CN)

(73) Assignee: Artery Technology Co., Ltd., Chongqing (CN)

( * ) Notice: Subject to any disclaimer, the term of this patent is extended or adjusted under 35 U.S.C. 154(b) by 0 days.

(21) Appl. No.: 16/285,099

(22) Filed: Feb. 25, 2019

(30) Foreign Application Priority Data

Sep. 28, 2018 (CN) .......................... 2018 1 1140682

(51) Int. Cl.
*H03K 17/22* (2006.01)
*G05F 3/24* (2006.01)

(52) U.S. Cl.
CPC ............... *G05F 3/24* (2013.01); *H03K 17/22* (2013.01)

(58) Field of Classification Search
CPC .. H03K 17/223; H03K 17/082; H03K 17/165; H03K 19/08; H03K 3/011; H03K 3/012; H03K 4/08; G05F 1/46; G05F 1/575; G05F 1/10; G05F 3/267; G05F 3/30

USPC .......................................... 327/142, 143, 198
See application file for complete search history.

(56) References Cited

U.S. PATENT DOCUMENTS

| | | | | |
|---|---|---|---|---|
| 6,188,266 B1* | 2/2001 | Shimoda | .............. | H03K 3/0231 327/393 |
| 8,063,622 B2* | 11/2011 | Kung | ...................... | H02M 1/36 323/288 |
| 2008/0218223 A1* | 9/2008 | Kimura | .................... | H03K 5/19 327/142 |

* cited by examiner

*Primary Examiner* — John W Poos
(74) *Attorney, Agent, or Firm* — Winston Hsu

(57) ABSTRACT

A dynamic bias current generator includes a detection circuit and at least one current generating circuit. The detection circuit is used for generating a detection signal, and includes: current source coupled to the power supply voltage; a first set of transistors coupled between the current source and the ground voltage; a second set of transistors coupled between the power supply voltage and the ground voltage; a first capacitor coupled to the power supply voltage; and a second capacitor coupled to the ground voltage. The at least one current generating circuit is used for generating dynamic bias current according to the detection signal, and includes multiple transistors and a terminal for outputting voltage signal corresponding the dynamic bias current. The dynamic bias current may be used to increase the reaction speed of the comparator and may be used in a power down detection circuit.

9 Claims, 5 Drawing Sheets

DYNAMIC BIAS CURRENT GENERATOR AND ASSOCIATED ELECTRONIC DEVICE

BACKGROUND OF THE INVENTION

1. Field of the Invention

The present invention relates to a low power-consumption circuit design, and more particularly, to a dynamic bias current generator and associated electronic device.

2. Description of the Prior Art

Reset control mechanisms, such as the power-on reset (POR), power-down reset (PDR), brown-out reset (BOR), etc., are important concerns in the circuit design. For example, when powering on an electronic system, a certain period of time is required for the power supply to make the voltage stable and reach a steady-state value. During such transition, if a reset command is not provided, the initial states of storage components typically cannot be defined, and thus the circuit behaviors of the entire electronic system cannot be determined.

A related art technique attempts to directly apply a reset control mechanism onto a low power-consumption circuit design, but some bothersome problems may be encountered. For example, the speed of a comparator can be limited by a lower bias current, while in some cases, the low power-consumption design requires the comparator to have a high response speed. More particularly, when it comes to the power-down reset or the brown-out reset circuit, the comparator is required to have a high speed response to detect whether the voltage level of the power supply is lower than a trigger point, in order to generate a corresponding reset control signal. As a result, the related art faces the dilemma of being unable to meet both the low power-consumption and high processing speed. Hence, there is a need for a novel mechanism to improve the overall performance without introducing a side effect or in a way that less likely to introduce a side effect.

SUMMARY OF THE INVENTION

An objective of the present invention is to provide a dynamic bias current generator and associated electronic device, in order to solve the aforementioned problems.

Another objective of the present invention is to provide a dynamic bias current generator and associated electronic device, in order to reach an optimal performance without introducing a side effect or in a way that less likely to introduce a side effect.

At least one embodiment of the present invention provides a dynamic bias current generator which comprises a detection circuit and at least one current generating circuit. The detection circuit is coupled between a power supply voltage and a ground voltage, and is arranged to detect the power supply voltage in order to generate a detection signal, wherein the detection circuit comprises current source, a first set of transistors and a second set of transistors. The current source is coupled to the power supply voltage. The first set of transistors are coupled between the current source and the ground voltage, wherein the current source and the first set of transistors are located on a first path between the power supply voltage and the ground voltage. The second set of transistors are coupled between the power supply voltage and the ground voltage, wherein the second set of transistors are located on a second path between the power supply voltage and the ground voltage, and a control terminal of a transistor of the first set of transistors and a control terminal of a transistor of the second set of transistors are coupled to each other. The first capacitor has a first terminal and a second terminal, wherein the first terminal of the first capacitor is coupled to the power supply voltage, and the second terminal of the first capacitor is coupled to another terminal of the transistor of the second set of transistors. The second capacitor has a first terminal and a second terminal, wherein the first terminal of the second capacitor is coupled to the control terminal of the transistor of the first set of transistors and the control terminal of the transistor of the second set of transistors, and the second terminal of the second capacitor is coupled to the ground voltage. The at least one current generating circuit is coupled between the power supply voltage and the ground voltage and coupled to the detection circuit, and is arranged to generate a dynamic bias current according to the detection signal. The at least one current generating circuit comprises multiple transistors and a terminal. The multiple transistors are coupled between the power supply voltage and the ground voltage, and arranged to generate the dynamic bias current according to the detection signal, wherein the control terminal of at least one transistor of the multiple transistors is coupled to another terminal of the transistor of the second set of transistors. The terminal of the at least one current generating circuit is arranged to output voltage signal corresponding the dynamic bias current, in order to perform reset control.

At least one embodiment of the present invention provides an electronic device equipped with the aforementioned dynamic bias current generator. The electronic device further comprises a processing circuit, a power supply circuit and a reset control circuit. The processing circuit is arranged to control operations of the electronic device. The power supply circuit is coupled to the processing circuit, and is arranged to provide power to the processing circuit. Further, the reset control circuit may increase the responding speed of power down detection and make it be able to output a high speed power down reset signal in order to rest the processing circuit.

The present invention provides advantages such as: the dynamic bias current generator may generate dynamic bias current in order to increase the responding speed of the comparator, making the electronic device have the characteristics of low power-consumption and high processing speed. For example, when the voltage level of the power supply ramps down, the reset control circuit is capable of introducing dynamic bias current in order to increase the comparator speed. Hence, the present invention dynamic bias current generator and associated electronic device may perform proper controls, in order to reach the optimal performance of the electronic device. Further, the present invention solves the difficulties encountered in related art techniques, such as the dilemma of unable to reach the objectives of power-consumption and high processing speed.

These and other objectives of the present invention will no doubt become obvious to those of ordinary skill in the art after reading the following detailed description of the preferred embodiment that is illustrated in the various figures and drawings.

DETAILED DESCRIPTION

Embodiments of the present invention provides a dynamic bias current generator, which may comprise a detection circuit and at least one current generating circuit (e.g. one or more current generating circuits). For better understanding, the dynamic bias current generator may be placed in a reset control circuit of an electronic device, and more particularly, may be used as a comparator for monitoring the power supply voltage, in order to perform reset control on the electronic device. The dynamic bias current generator may generate dynamic bias current for accelerating the speed of the comparator, making the electronic device have characteristics of low power-consumption and high speed performance. Examples of the dynamic bias current generator may comprise (but are not limited to): the dynamic bias current generator 100 shown in FIG. 1, and the dynamic bias current generator 200 shown in FIG. 2. The structures shown in FIG. 1 and FIG. 2 adopt certain types of Metal Oxide Semiconductor Field Effect Transistors (MOSFETs), such as P-type and N-type MOSFETs, but the present invention is not limited thereto.

Figure 1:
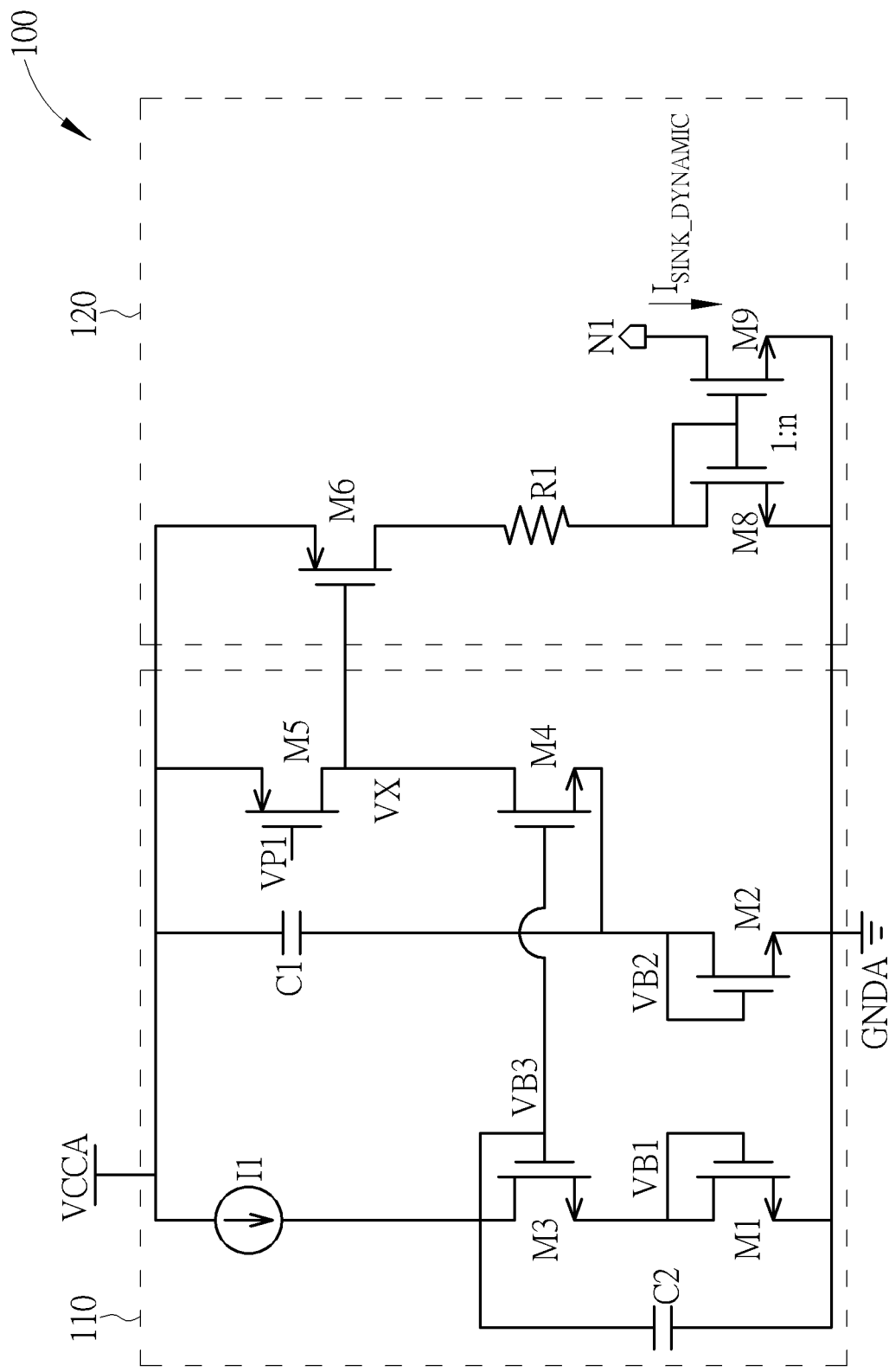
FIG. 1 is a diagram illustrating a dynamic bias current generator according to an embodiment of the present invention.

FIG. 1 is a diagram illustrating a dynamic bias current generator 100 according to an embodiment of the present invention. The dynamic bias current generator 100 may comprise a detection circuit 110 and a current generating circuit 120 that are coupled between a power supply voltage VCCA and a ground voltage GNDA and coupled to each other. The detection circuit 110 and the current generating circuit 120 may be taken as examples of the aforementioned detection circuit and the aforementioned at least one current generating circuit, respectively. The detection circuit 110 may comprise a current source that is arranged for generating the current I1 and coupled to the power supply voltage VCCA, and a first set of transistors {M1, M3} coupled between the current source and the ground voltage GNDA, wherein the current source and the first set of transistors {M1, M3} are located on a first path between the power supply voltage VCCA and the ground voltage GNDA (e.g. the path passing through the current source and the transistors M3 and M1, and more particularly, the current path of the current I1); a second set of transistors {M2, M4, M5} coupled between the power supply voltage VCCA and the ground voltage GNDA, wherein the second set of the transistors {M2, M4, M5} are located on a second path between the power supply voltage VCCA and the ground voltage GNDA (e.g. the path passing through the transistors M5, M4 and M2), and the control terminal (e.g. the gate terminal) of the transistor M3 in the first set of transistors {M1, M3} and the control terminal (e.g. the gate terminal) of the transistor M4 in the second set of transistors {M2, M4, M5} are coupled to each other; a capacitor C1 that has a first terminal and a second terminal, wherein the first terminal and the second terminal of the capacitor C1 (e.g. the upper terminal and the lower terminal thereof) are respectively coupled to the power supply voltage VCCA and another terminal (e.g. the source terminal) of the transistor M4 in the second set of transistors {M2, M4, M5}; and a capacitor C2 that has a first terminal and a second terminal, wherein the first terminal of the capacitor C2 (e.g. the upper terminal thereof) is coupled to the control terminal (e.g. the gate terminal) of the transistor M3 in the first set of transistors {M1, M3} and the control terminal (e.g. the gate terminal) of the transistor M4 in the second set of transistors {M2, M4, M5}, and the second terminal of the capacitor C2 (e.g. the lower terminal thereof) is coupled to the ground voltage GNDA. Further, the current generating circuit 120 may comprise: multiple transistors that are coupled between the power supply voltage VCCA and the ground voltage GNDA, such as the transistors M6, M8 and M9, wherein the control terminal (e.g. the gate terminal) of at least one transistor in the multiple transistors, such as the control terminal (e.g. the gate terminal) of the transistor M6, is coupled to another terminal (e.g. the drain terminal) of the transistor M4 in the second set of transistors {M2, M4, M5}; a resistor R1 coupled between the transistors M6 and M8; and a terminal N1 which is coupled to a terminal (e.g. the drain terminal) of the transistor M9.

As shown in FIG. 1, two terminals of each transistor of the transistors M1 and M2 are coupled to each other, making this transistor (i.e. the aforementioned each transistor, such as the transistors M1 or M2) be configured into a diode-connected transistor. Further, the transistor M1 is coupled to the current source via the transistor M3, and is coupled between the transistor M3 and the ground voltage GNDA. The transistor M2 is coupled to the transistor M5 via the transistor M4, and is coupled between the transistor M4 and the ground voltage GNDA. The transistor M5 is coupled between the power supply voltage VCCA and the transistor M4, and the aforementioned another terminal (e.g. the drain terminal) of the transistor M4 in the second set of transistors {M2, M4, M5} is a terminal of the transistor M4 that is used for coupling the transistor M4 to the transistor M5. For example, the voltage VP1 may be a reference voltage that has a predetermined voltage level. Further, the transistor M6, the resistor R1 and the transistor M8 are located on a third path between the power supply voltage VCCA and the ground voltage GNDA (e.g. the path passing through the transistor M6, resistor R1 and the transistor M8), and the respective control terminals (e.g. the gate terminals) of the transistors M8 and M9 are coupled to each other, wherein two terminals of the transistor M8 are coupled to each other, making the transistor M8 be configured into a diode-connected transistor.

According to this embodiment, the detection circuit 110 may perform detection operations on the power supply voltage VCCA in order to generate a detection signal such as the voltage VX, and the current generating circuit 120 may generate corresponding dynamic bias current $I_{SINK\_DYNAMIC}$ according to the detection signal (e.g. the voltage VX), and the terminal N1 may be connected to the tail power end of the comparator to increase the working current corresponding to the comparator in order to increase the reaction speed. For example, the multiple transistors in the current generating circuit 120, and more particularly, the transistor M6, the resistor R1, the transistors M8 and M9, may generate the dynamic bias current $I_{SINK\_DYNAMIC}$ according to the detection signal. When the voltage level of the power supply voltage VCCA drops suddenly, the voltage VB2 will also drop. In this situation, the detection signal (e.g. the voltage VX) may drop rapidly, thereby turning on the transistor M6 within a short time. This may cause a sudden occurrence of current on the third path (e.g. the path passing through the transistor M6, the resistor R1, and the transistor M8), such as the current flowing through the transistor M8. The ratio of the respective specific parameters (e.g. the respective channel widths) of the transistors M9 and M8, such as the ratio of the specific parameter (e.g. the channel width) of the transistor M9 to the specific parameter (e.g. the channel width) of the transistor M8, may be equal to n, which makes the dynamic bias current $I_{SINK\_DYNAMIC}$ passing through the transistor M9 be n times the current flowing through the transistor M8, wherein n is greater than 1. Hence, the current generating circuit 120 may generate the corresponding dynamic bias current $I_{SINK\_DYNAMIC}$ right after the power supply voltage VCCA begins to drop. With the n-times amplification between the transistors M9 and M8, the dynamic bias current $I_{SINK\_DYNAMIC}$ will be large enough. Assume that the resistor R1 has the resistance value R1 (which is named after this component but printed in Italics, for better comprehension), the dynamic bias current $I_{SINK\_DYNAMIC}$ may be expressed as follows:

$$I_{SINK\_DYNAMIC}=n*(((VCCA-VSS)-Vgs)/R1);$$

where Vgs may represent the reference voltage generated by a certain transistor (e.g. the transistor M8 that is configured into the diode-connected transistor), such as the magnitude of the gate-source voltage (the voltage difference between the gate and the source) of this transistor, but the present invention is not limited thereto. In a situation where VSS=0 (V), the above equation can be simplified as follows:

$$I_{SINK\_DYNAMIC}=n*((VCCA-Vgs)/R1).$$

For example, the terminal N1 may be arranged to couple the transistor M9 to a tail terminal of a comparator. When the dynamic bias current $I_{SINK\_DYNAMIC}$ flows through the comparator, the terminal N1 may output the dynamic bias current $I_{SINK\_DYNAMIC}$ in order to increase the responding speed of the comparator. In a situation where the power is stable, the current generating circuit 120 may control and reduce the magnitude of the dynamic bias current $I_{SINK\_DYNAMIC}$ down to zero (e.g. a tiny amount of leakage current is ignored) in order to save power. Hence, the dynamic bias current generator 100 can provide the electronic device with both of low power-consuming and high processing speed characteristics.

Figure 2:
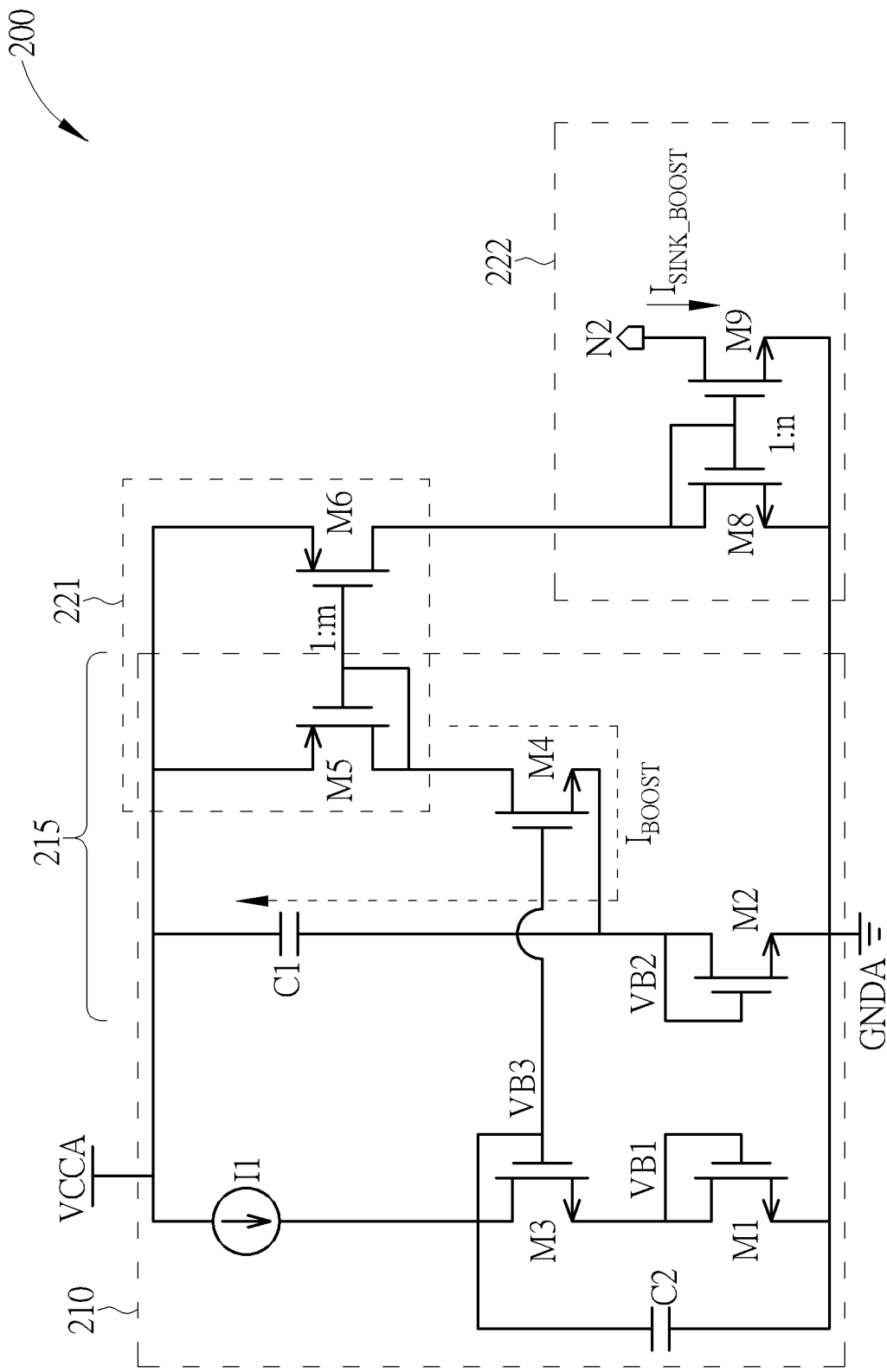
FIG. 2 is a diagram illustrating a dynamic bias current generator according to another embodiment of the present invention.

FIG. 2 is a diagram illustrating a dynamic bias current generator 200 according to another embodiment of the present invention. The dynamic bias current generator 200 may comprise a detection circuit 210 and a set of current generating circuits 221 and 222 that are coupled between the power supply voltage VCCA and the ground voltage GNDA, wherein the detection circuit 210 and the current generating circuits 221 and 222 are coupled to each other. The detection circuit 210 may be taken as an example of the aforementioned detection circuit, and the set of current generating circuits 221 and 222 may be taken as an example of the aforementioned at least one current generating circuit. In comparison with the structure shown in FIG. 1, most of the components within the structure shown in FIG. 2 (e.g. the current source which generates the current I1, the transistors M1-M6 and M8 and M9, the capacitors C1 and C2, etc.) are either identical or similar to those of the structure shown in FIG. 1, respectively, but some modifications made in the structure of FIG. 2 are worth of noticing. For example, the coupling manner of the transistor M5 in FIG. 2 is changed, and the transistors M5 and M6 in FIG. 2 are designed to having m-times current-amplifying functions. In response to the changes of the structure, the aforementioned terminal N1 and the dynamic bias current $I_{SINK\_DYNAMIC}$ are respectively replaced with the terminal N2 and the dynamic bias current $I_{SINK\_BOOST}$, and the terminal N2 is coupled to a terminal (e.g. the drain terminal) of the transistor M9. In this embodiment, the current generating circuit 221 may comprise the transistors M5 and M6, and the detection circuit 210 and the current generating circuit 221 may share the transistor M5, wherein the transistor M5 is located on the second path, and the respective control terminals (e.g. the gate terminals) of the transistors M5 and M6 are coupled to each other. The control terminals (e.g. the gate terminals) of the transistors M5 and M6 are coupled to the drain terminal of the transistor M4. Further, the current generating circuit 222 may comprise the transistors M8 and M9, wherein the transistors M6 and M8 are located on the third path between the power supply voltage VCCA and the ground voltage GNDA (e.g. the path passing through the transistors M6 and M8), and the respective control terminals (e.g. the gate terminals) of the transistors M8 and M9 are coupled to each other.

According to this embodiment, the detection circuit 210 may perform detection operations on the power supply voltage VCCA in order to generate a detection signal such as the current $I_{BOOST}$, and the current generating circuits 221 and 222 may generate the corresponding dynamic bias current $I_{SINK\_BOOST}$ according to the detection signal (e.g. the current $I_{BOOST}$), and the terminal N2 may be arranged to output a signal corresponding to the dynamic bias current $I_{SINK\_BOOST}$ for performing reset control. For example, the multiple transistors in the current generating circuits 221 and 222 (e.g. the transistor M5, M6, M8 and M9) may generate the dynamic bias current $I_{SINK\_BOOST}$ according to the detection signal. The detection signal may represent the current $I_{BOOST}$ flowing through the transistor M5, and the current $I_{BOOST}$ may be regarded as boost current, wherein the boost circuit 215 in the detection circuit 210 may comprise the transistors M2, M4 and M5 and the capacitor C1, and may generate the boost current. When the voltage level of the power supply voltage VCCA drops suddenly, the voltage VB2 will also drop. In this situation, the detection signal (e.g. the current $I_{BOOST}$) may rise rapidly, thereby causing a sudden occurrence of current on the third path (e.g. the path passing through the transistors M6 and M8), such as the current flowing through the transistors M6 and M8.

As shown in FIG. 2, two terminals of each transistor of the transistors M5 and M8 are coupled to each other, making this transistor (i.e. the aforementioned each transistor, such as the transistors M5 or M8) be configured into a diode-connected transistor. The ratio of the respective specific parameters (e.g. the respective channel widths) of the transistors M6 and M5, such as the ratio of the specific parameter (e.g. the channel width) of the transistor M6 to the specific parameter (e.g. the channel width) of the transistor M5, may be equal to m, making the current flowing through the transistor M6 m times the current $I_{BOOST}$ flowing through the transistor M5, wherein m is greater than 1. Further, the ratio of the respective specific parameters (e.g. the respective channel widths) of the transistors M9 and M8, such as the ratio of the specific parameter (e.g. the channel width) of the transistor M9 to the specific parameter (e.g. the channel width) of the transistor M8, may be equal to n, making the dynamic bias current $I_{SINK\_BOOST}$ flowing through the transistor M9 be n times the current flowing through the transistor M8, wherein n is greater than 1. Since the current flowing through the transistor M8 equals to the current flowing through the transistor M6, in the situation where the dynamic bias current $I_{SINK\_BOOST}$ flowing through the transistor M9 is n times the current flowing through the transistor M8 current and the current flowing through the transistor M6 is m times the current $I_{BOOST}$ flowing through the transistor M5, the dynamic bias current $I_{SINK\_BOOST}$ flowing through the transistor M9 is (m*n) times the current $I_{BOOST}$ flowing through the transistor M5. As a result, the current generating circuits 221 and 222 may generate the dynamic bias current $I_{SINK\_BOOST}$ right after the power supply voltage VCCA begins to drop. With the m-times amplification between the transistors M6 and M5 and the n-times amplification between the transistors M9 and M8, the dynamic bias current $I_{SINK\_BOOST}$ will be large enough. Assume that the capacitor C1 has the capacitance value C1 (which is named after this component but printed in Italics, for better comprehension), the dynamic bias current $I_{SINK\_BOOST}$ may be expressed as follows:

$$I_{SINK\_BOOST}=(m*n)*C1*dV/dt;$$

where dV/dt may represent the variation of the power supply voltage VCCA with respect to time, but the present invention is not limited thereto.

For example, the terminal N2 may be arranged to couple the transistor M9 to the comparator. When the dynamic bias current $I_{SINK\_BOOST}$ flows through the comparator, the terminal N2 may output the dynamic bias current $I_{SINK\_BOOST}$ in order to increase the responding speed of the comparator. In a situation where the voltage is stable, the current generating circuits 221 and 222 may control and reduce the magnitude of the dynamic bias current $I_{SINK\_BOOST}$ down to zero (e.g. a tiny amount of leakage current is ignored) in order to be more power-saving. Hence, the dynamic bias current generator 200 can make the electronic device have both of the low power-consuming and high processing speed characteristics.

In some embodiments, since the current generating circuits 221 and 222 may perform the (m*n)-times current-amplification, under the goal of obtaining the same magnitude of current, the capacitor C1 may be implemented with a small capacitor such as that with small capacitance, e.g. the capacitance value C1 may be as small as 0.5 pF (picofarad), but the present invention is not limited thereto. According to some embodiments, with the increasing of the value of (m*n), the capacitor C1 may be implemented with a capacitor with a much smaller capacitance value.

Figure 3:
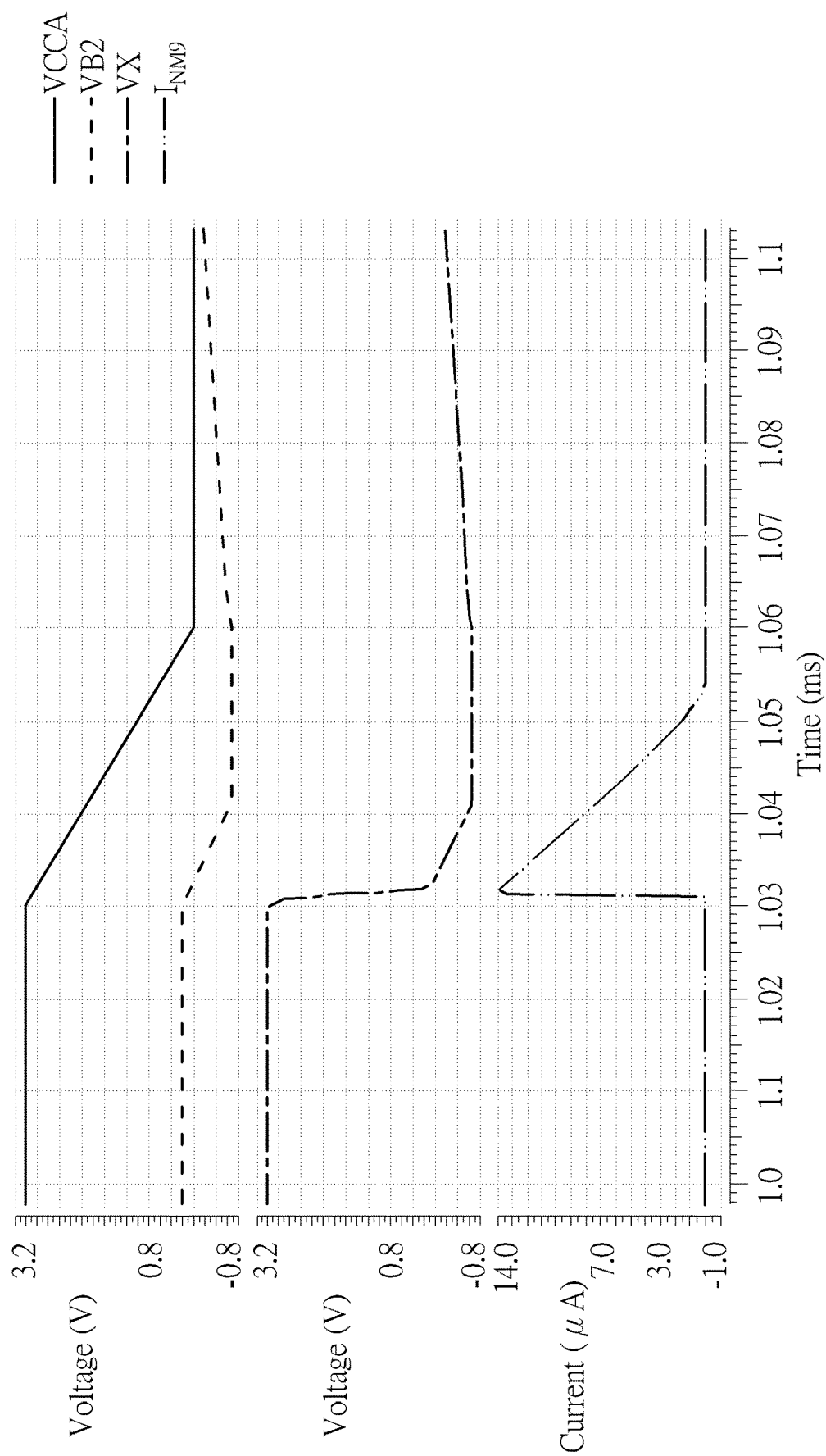
FIG. 3 is a diagram illustrating an example of the dynamic bias current shown in FIG. 1 that may vary with respect to the change of the power supply voltage.

FIG. 3 is a diagram illustrating an example of the dynamic bias current $I_{SINK\_DYNAMIC}$ shown in FIG. 1 that may vary with respect to the change of the power supply voltage VCCA, wherein the current $I_{NM9}$ passing through the drain of the transistor M9 may be taken as an example of the aforementioned dynamic bias current $I_{SINK\_DYNAMIC}$, and some associated signals (e.g. the voltages VB2 and VX) are also depicted in FIG. 3 for reference, but the present invention is not limited thereto. In the example of FIG. 3, the unit of time may be millisecond (ms), the unit of voltage may be volt (V), and the unit of current may be microampere (µA), but the present invention is not limited thereto.

Figure 4:
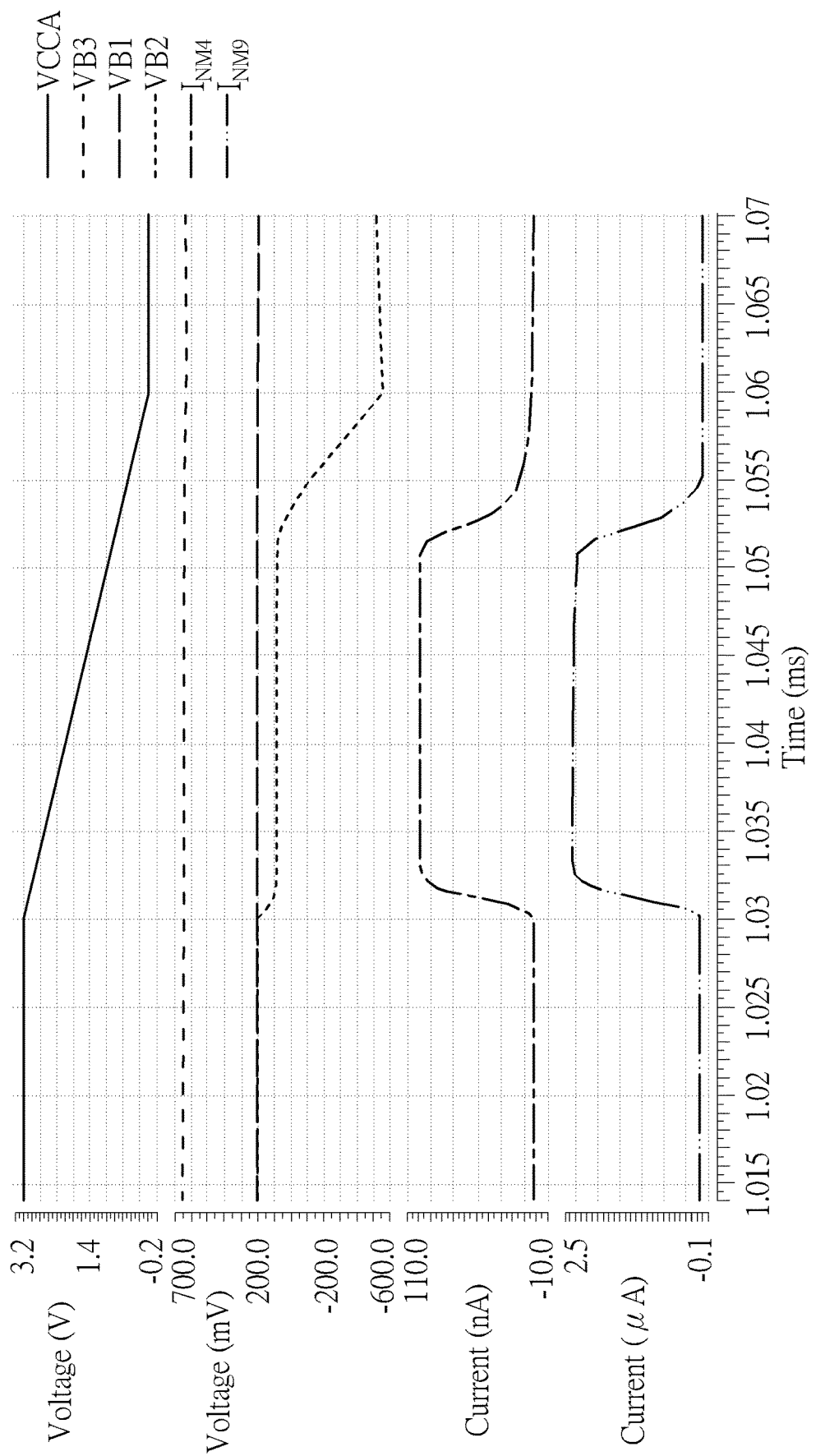
FIG. 4 is a diagram illustrating an example of the dynamic bias current shown in FIG. 2 that may vary with respect to the change of the power supply voltage.

FIG. 4 is a diagram illustrating an example of the dynamic bias current $I_{SINK\_BOOST}$ shown in FIG. 2 that may vary with respect to the change of the power supply voltage VCCA, wherein the current $I_{NM9}$ passing through the drain of the transistor M9 may be taken as an example of the dynamic bias current $I_{SINK\_BOOST}$, and some associated signals (e.g. voltages VB3, VB1, and VB2 and the current $I_{NM4}$ passing through the drain of the transistor M4) are also depicted in FIG. 4 for reference, but the present invention is not limited thereto. In the example of FIG. 4, the unit of time may be millisecond (ms), the unit of voltage may be volt (V) or millivolt (mV), and the unit of current may be nanoampere (nA) or microampere (µA), but the present invention is not limited thereto.

Figure 5:
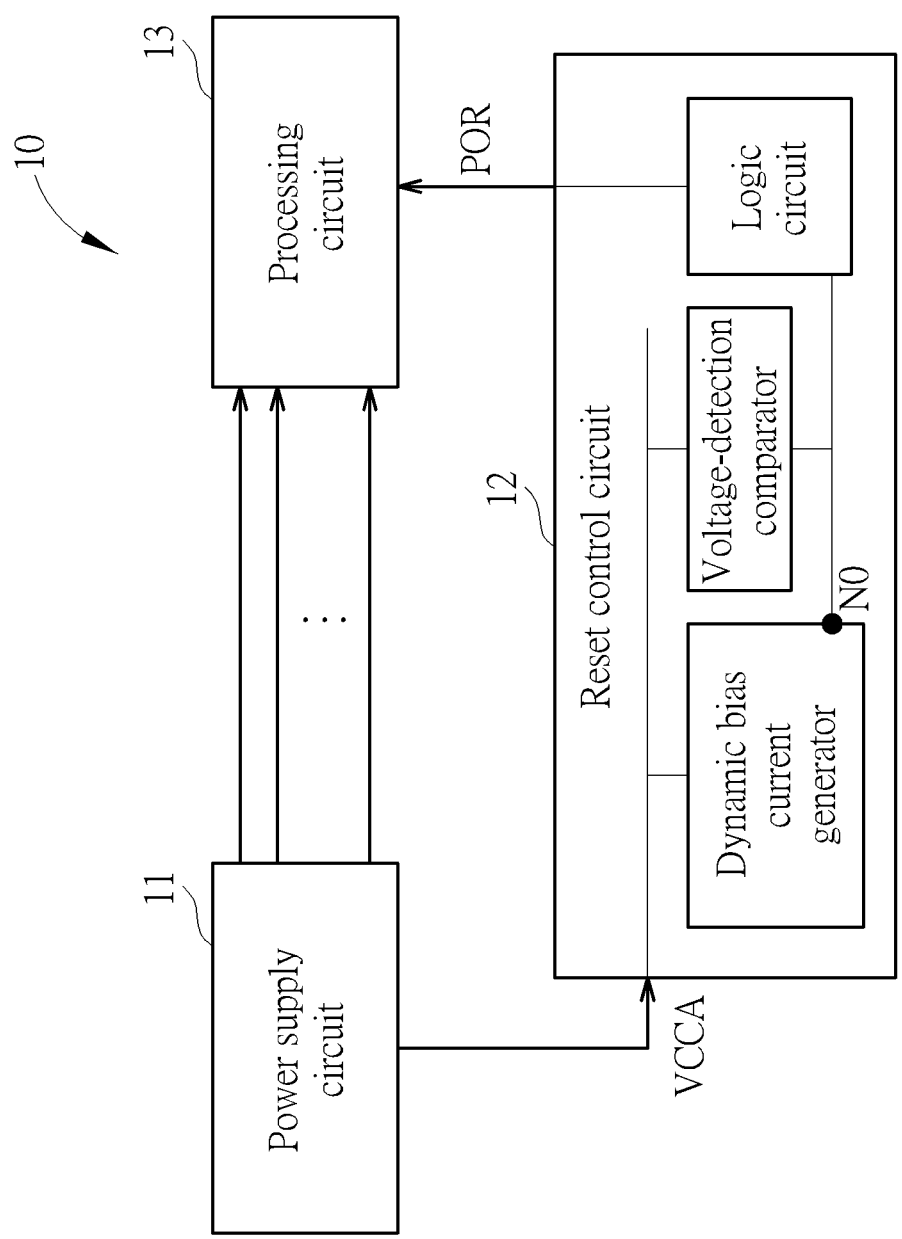
FIG. 5 is a diagram illustrating an electronic device according to an embodiment of the present invention.

FIG. 5 is a diagram illustrating an electronic device 10 according to an embodiment of the present invention, wherein the electronic device 10 may be taken as an example of the aforementioned electronic device. The electronic device 10 may comprise a power supply circuit 11, a reset control circuit 12, and a processing circuit 13 that are coupled to one another. For example, the reset control circuit 12 may comprise the dynamic bias current generator (e.g. the dynamic bias current generators 100 or 200), the comparator and a logic circuit (e.g. a logic gate), and the processing circuit 13 may comprise a processor, a microprocessor, and/or a microcontroller, and more particularly, may comprise an associated circuit such as a storage component (e.g. a memory, a digital register, and an analog integrator), but the present invention is not limited thereto. The processing circuit 13 may control the operations of the electronic device 10, and the power supply circuit 11 may provide power for the processing circuit 13, and more particularly, may output at least one power supply voltage (e.g. one or more power supply voltages), which may include the power supply voltage VCCA. Further, the reset control circuit 12 may increase the detection speed of the comparator during the power drop according to the dynamic bias current (e.g. the dynamic bias current $I_{SINK\_DYNAMIC}$ or $I_{SINK\_BOOST}$) at the terminal NO (e.g. the terminal N1 or N2) and thereby generate a real time power-down reset signal POR, and perform reset control on the processing circuit 13 according to the power-down reset signal POR, wherein the reset control circuit 12 and the power-on reset signal POR may be taken as examples of the aforementioned reset control circuit and the aforementioned reset signal respectively, but the present invention is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic bias current generator, comprising:
   a detection circuit, coupled between a power supply voltage and a ground voltage, the detection circuit arranged to detect the power supply voltage in order to generate a detection signal, wherein the detection circuit comprises:
   a current source, coupled to the power supply voltage;
   a first set of transistors, coupled between the current source and the ground voltage, wherein the current source and the first set of transistors are located on a first path between the power supply voltage and the ground voltage, and the first set of transistors comprise a first transistor and a third transistor;
   a second set of transistors, coupled between the power supply voltage and the ground voltage, wherein the second set of transistors are located on a second path between the power supply voltage and the ground voltage, the second set of transistors comprise a second transistor, a fourth transistor and a fifth transistor, and a control terminal of a transistor of the first set of transistors and a control terminal of a transistor of the second set of transistors are coupled to each other, wherein the transistor of the first set of transistors represents the third transistor, the transistor of the second set of transistors represents the fourth transistor, and two terminals of each transistor of the first transistor and the second transistor are coupled to each other, making said each transistor be configured into a diode-connected transistor;

a first capacitor, having a first terminal and a second terminal, wherein the first terminal of the first capacitor is coupled to the power supply voltage, and the second terminal of the first capacitor is coupled to another terminal of the transistor of the second set of transistors; and a second capacitor, having a first terminal and a second terminal, wherein the first terminal of the second capacitor is coupled to the control terminal of the transistor of the first set of transistors and the control terminal of the transistor of the second set of transistors, and the second terminal of the second capacitor is coupled to the ground voltage; and at least one current generating circuit, coupled between the power supply voltage and the ground voltage and coupled to the detection circuit, the at least one current generating circuit arranged to generate a dynamic bias current according to the detection signal, wherein the at least one current generating circuit comprises:

multiple transistors, coupled between the power supply voltage and the ground voltage, the multiple transistors arranged to generate the dynamic bias current according to the detection signal, wherein a control terminal of at least one transistor of the multiple transistors is coupled to another terminal of the transistor of the second set of transistors; and a terminal, arranged to output a voltage signal corresponding the dynamic bias current, in order to perform reset control.

2. The dynamic bias current generator of claim 1, wherein the first transistor is coupled to the current source via the third transistor and coupled between the third transistor and the ground voltage; the second transistor is coupled to the fifth transistor via the fourth transistor and coupled between the fourth transistor and the ground voltage; the fifth transistor is coupled between the power supply voltage and the fourth transistor; and the other terminal of the transistor of the second set of transistors is a terminal of the fourth transistor for coupling to the fifth transistor.

3. The dynamic bias current generator of claim 1, wherein the multiple transistors comprise a sixth transistor, an eighth transistor and a ninth transistor, and the at least one current generating circuit further comprises:

a resistor, wherein the sixth transistor, the resistor and the eighth transistor are located on a third path between the power supply voltage and the ground voltage, and respective control terminals of the eighth transistor and the ninth transistor are coupled to each other.

4. The dynamic bias current generator of claim 3, wherein two terminals of the eighth transistor are coupled to each other, making the eighth transistor be configured into a diode-connected transistor; and a ratio of respective specific parameters of the ninth transistor and the eighth transistor is equal to n, making the dynamic bias current flowing through the ninth transistor be n times a current flowing through the eighth transistor, wherein n is greater than 1.

5. The dynamic bias current generator of claim 3, wherein the detection signal represents a voltage signal at a control terminal of the sixth transistor.

6. The dynamic bias current generator of claim 1, wherein the multiple transistors comprise a fifth transistor, a sixth transistor, an eighth transistor and a ninth transistor, and the at least one current generating circuit comprises:

a first current generating circuit, comprising the fifth transistor and the sixth transistor, wherein the detection circuit and the first current generating circuit share the fifth transistor, the fifth transistor is located on the second path, and respective control terminals of the fifth transistor and the sixth transistor are coupled to each other; and a second current generating circuit, comprising the eighth transistor and the ninth transistor, wherein the sixth transistor and the eighth transistor are located on a third path between the power supply voltage and the ground voltage, and respective control terminals of the eighth transistor and the ninth transistor are coupled to each other.

7. The dynamic bias current generator of claim 6, wherein two terminals of each transistor within the fifth transistor and the eighth transistor are coupled to each other, making said each transistor be configured into a diode-connected transistor; a ratio of respective specific parameters of the sixth transistor and the fifth transistor is equal to m, making a current flowing through the sixth transistor be m times a current flowing through the fifth transistor, wherein m is greater than 1; and a ratio of respective specific parameters of the ninth transistor and the eighth transistor is equal to n, making the dynamic bias current flowing through the ninth transistor be n times a current flowing through the eighth transistor, wherein n is larger than 1.

8. The dynamic bias current generator of claim 6, wherein the detection signal represents a current flowing through the fifth transistor.

9. An electronic device equipped with the dynamic bias current generator of claim 1, comprising:

a processing circuit, arranged to control operations of the electronic device;

a power supply circuit, coupled to the processing circuit, the power supply circuit arranged to provide power to the processing circuit; and a reset control circuit, coupled to the processing circuit and the power supply circuit, the reset control circuit arranged to perform reset control on the processing circuit according to the dynamic bias current, wherein the reset control circuit comprises the dynamic bias current generator.

* * * * *